United States Patent [19]

Sheller

[11] 4,171,538

[45] Oct. 16, 1979

[54] ELASTIC STORE SLIP CIRCUIT APPARATUS FOR PREVENTING READ AND WRITE OPERATIONS INTERFERENCE

[75] Inventor: Daniel R. Sheller, Cedar Rapids, Iowa

[73] Assignee: Rockwell International Corporation, El Segundo, Calif.

[21] Appl. No.: 871,652

[22] Filed: Jan. 23, 1978

[51] Int. Cl.² .................. G11C 7/00; G06F 11/00; G06F 13/00
[52] U.S. Cl. .................................................. 364/900
[58] Field of Search ... 364/900 MS File, 200 MS File; 365/222; 235/92 DP, 92 SH; 178/69.1; 307/269; 360/26

[56] References Cited

U.S. PATENT DOCUMENTS

| | | | |
|---|---|---|---|
| 3,818,461 | 6/1974 | Ward et al. | 364/900 |
| 3,851,335 | 11/1974 | Elliott | 360/26 |
| 3,867,579 | 2/1975 | Colton et al. | 364/900 |
| 3,887,769 | 6/1975 | Cichetti, Jr. et al. | 178/69.1 |
| 3,941,982 | 3/1976 | Knollenberg et al. | 235/92 DP |
| 3,992,699 | 11/1976 | Krumbach | 364/900 |
| 4,040,027 | 8/1977 | van Es et al. | 364/900 |
| 4,051,353 | 9/1977 | Lee | 364/900 X |
| 4,054,747 | 10/1977 | Pachynski, Jr. | 178/69.1 |
| 4,054,949 | 10/1977 | Takezoe | 364/900 |
| 4,056,851 | 11/1977 | Hovagimyan et al. | 364/900 |
| 4,084,154 | 4/1978 | Panigrahi | 365/222 |

*Primary Examiner*—Melvin B. Chapnick
*Attorney, Agent, or Firm*—Bruce C. Lutz; Howard R. Greenberg; H. Fredrick Hamann

[57] ABSTRACT

A method of and circuitry for the operations of reading from and writing into a memory, each of which operations occurs on a sequential basis and each of which has different clock rates while preventing erroneous information from being read due to interference with attempted writing at the same address. This is accomplished by comparing the read and write addresses and when they approach each other, forcing the most significant bit of one of the sequentially occurring addresses to be altered in a step function whereby interference cannot occur. The above is used as an elastic store.

8 Claims, 8 Drawing Figures

ELASTIC STORE SLIP CIRCUIT APPARATUS FOR PREVENTING READ AND WRITE OPERATIONS INTERFERENCE

THE INVENTION

The present invention pertains generally to electronics and more specifically to a method for preventing interference between sequentially occurring nonsynchronous read-write operations in a single memory. Even more specifically it relates to reducing the electronic requirement for providing an elastic store function and still minimizing the occurrence of erroneous data.

Where a circuit uses a random access memory for read and write operations, there is occasionally interference between the two operations such that a read operation may be commenced part way through a write operation, thereby interfering with both operations. While this is an occasional problem where both the read and write functions are on a random basis, it can be an especially severe problem where both the read and write operations are on a sequential basis and their clocks, while nonsynchronous, are very close to being synchronous. Thus, the interference can continue to occur over many cells or blocks of the memory.

While the prior art solution to the problems of reducing elastic store register size requirements and reducing read/write inference problems in a random access memory are not known to the applicant, the present disclosures uses two approaches to reduce the problem of interference when a RAM is used as an elastic store mode. One is that the read and write operations are multiplexed so that only one at a time can happen and second, the read and write addresses are compared and when the counters generating the addresses approach the count of each other, a signal is provided to invert the most significant bit of one of the address counters and force this inverted bit into the count of the other address counter. This produces a maximum numerical difference between the two counts and thus the read and write operations can continue for a maximum amount of time before the addresses are again similar in number.

It is therefore an object of the present invention to provide an improved elastic store apparatus.

Other objects and advantages of the present invention may be ascertained from the reading of the specification and appended claims in conjunction with the drawings wherein:

Figure 1:
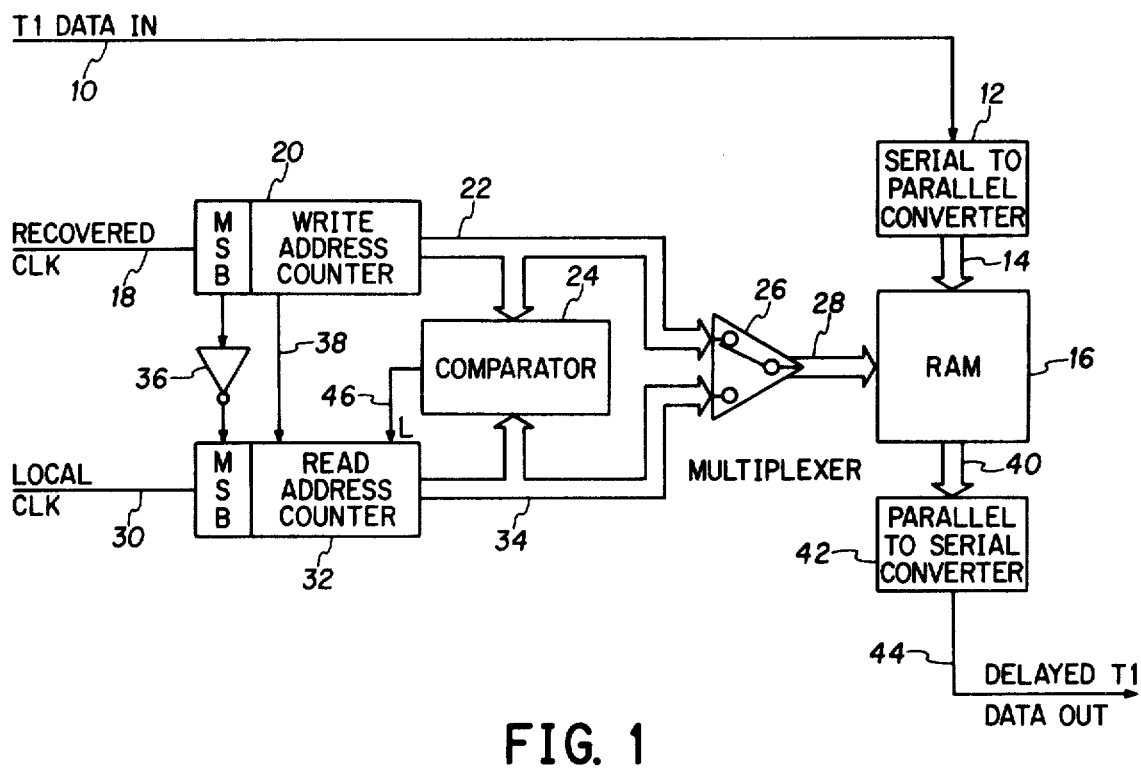
FIG. 1 is a simplified block diagram of one embodiment of the inventive concept.
Figure 3A:
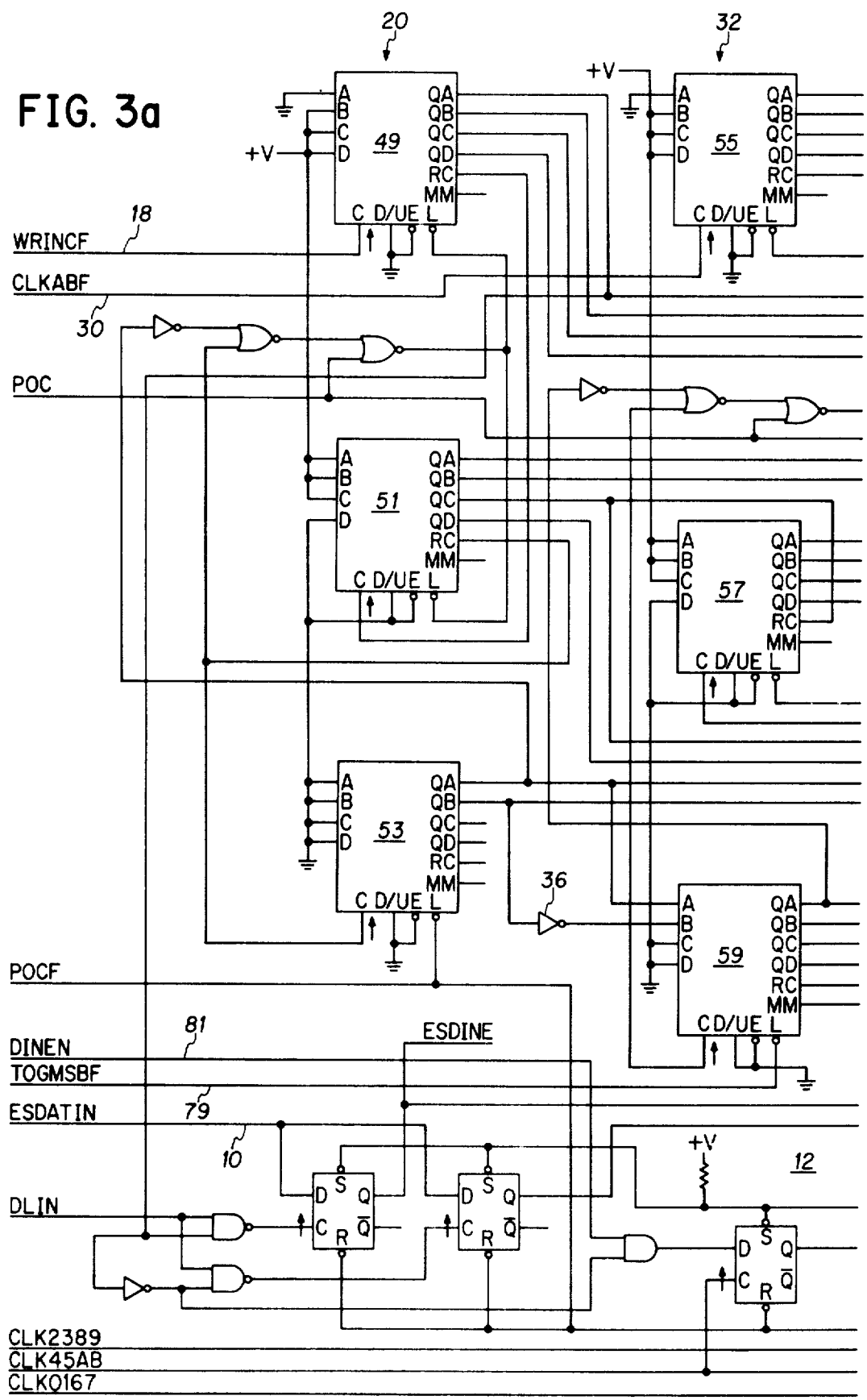
Figure 3B:
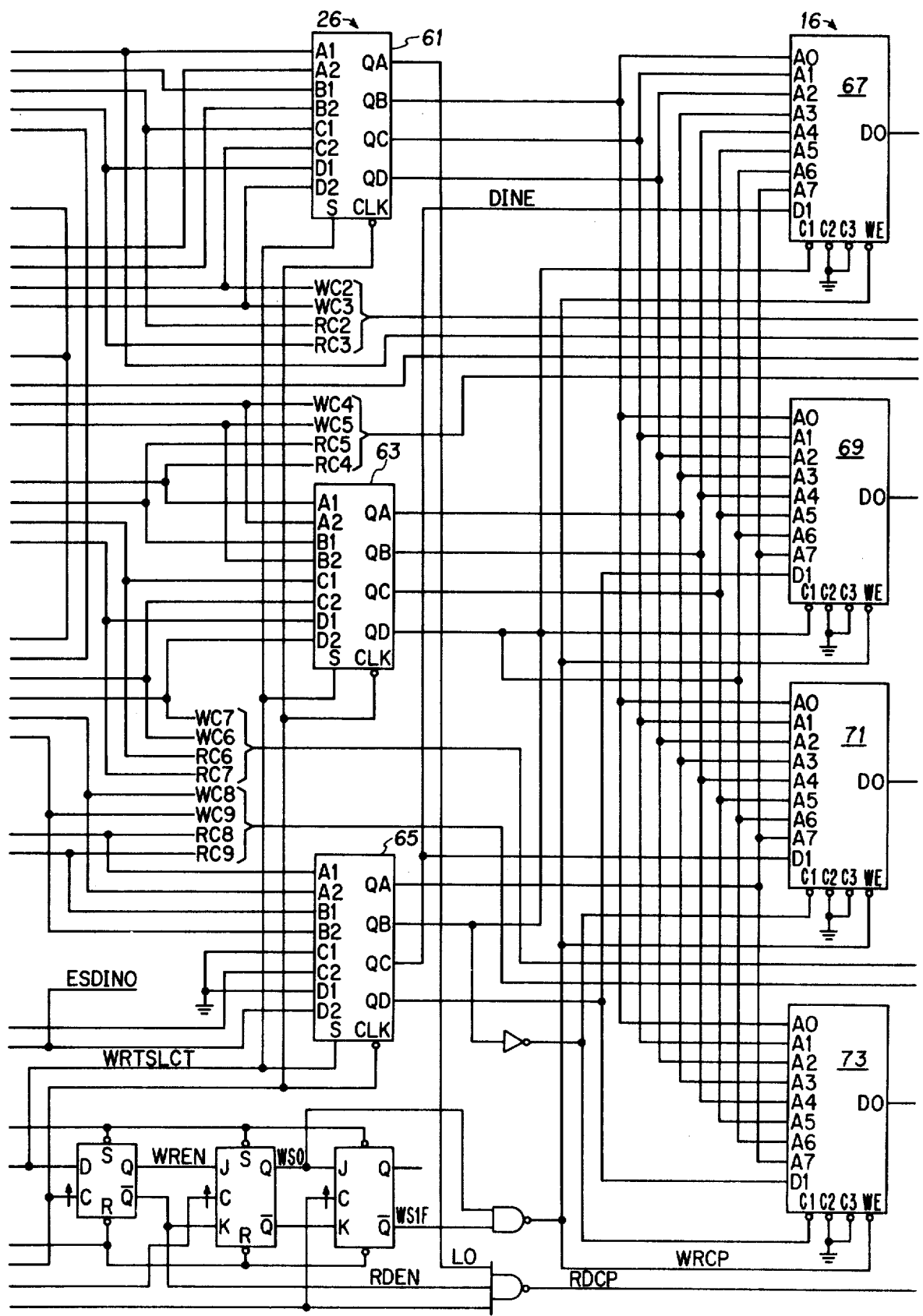
Figure 3C:
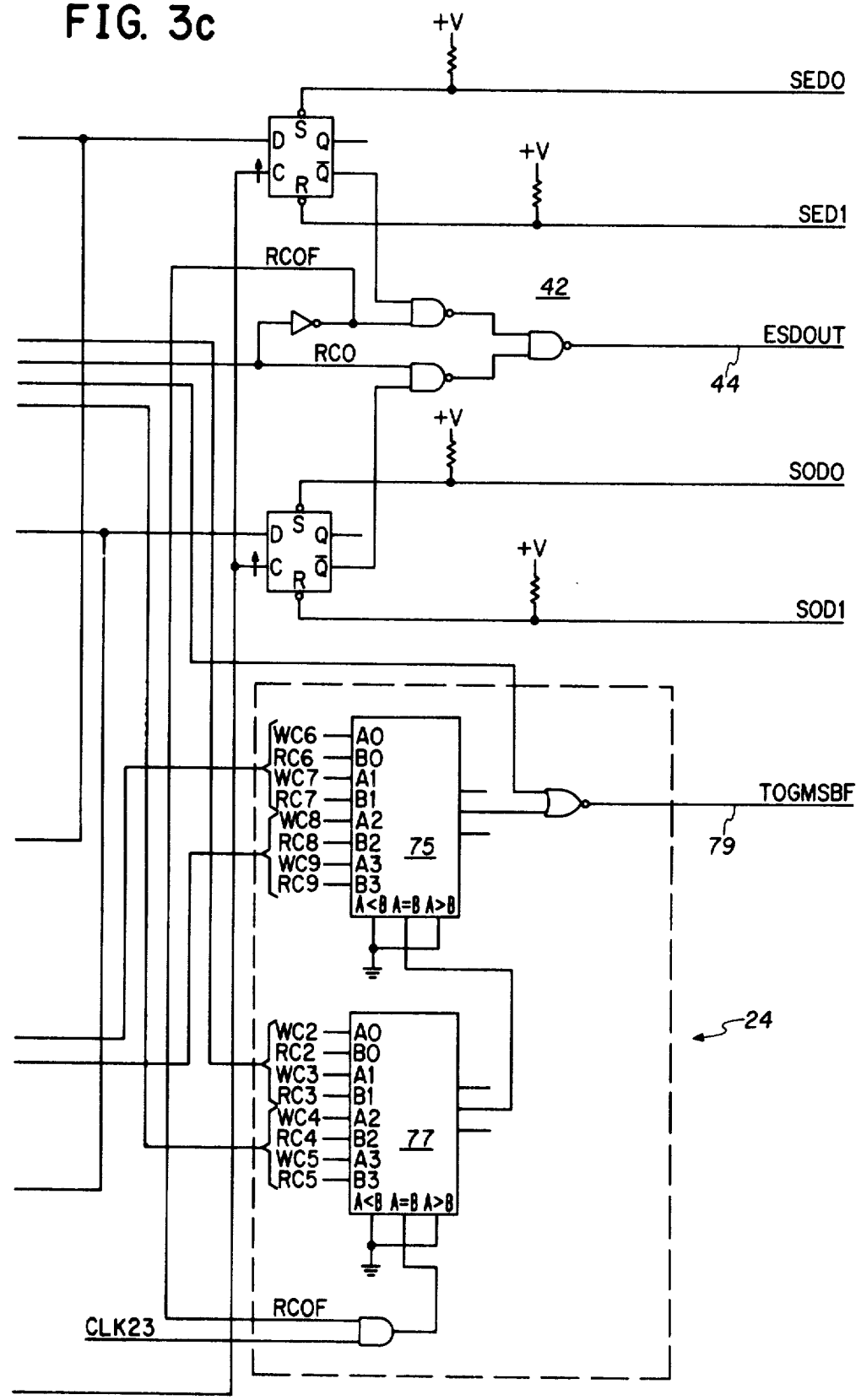
Figure 4:
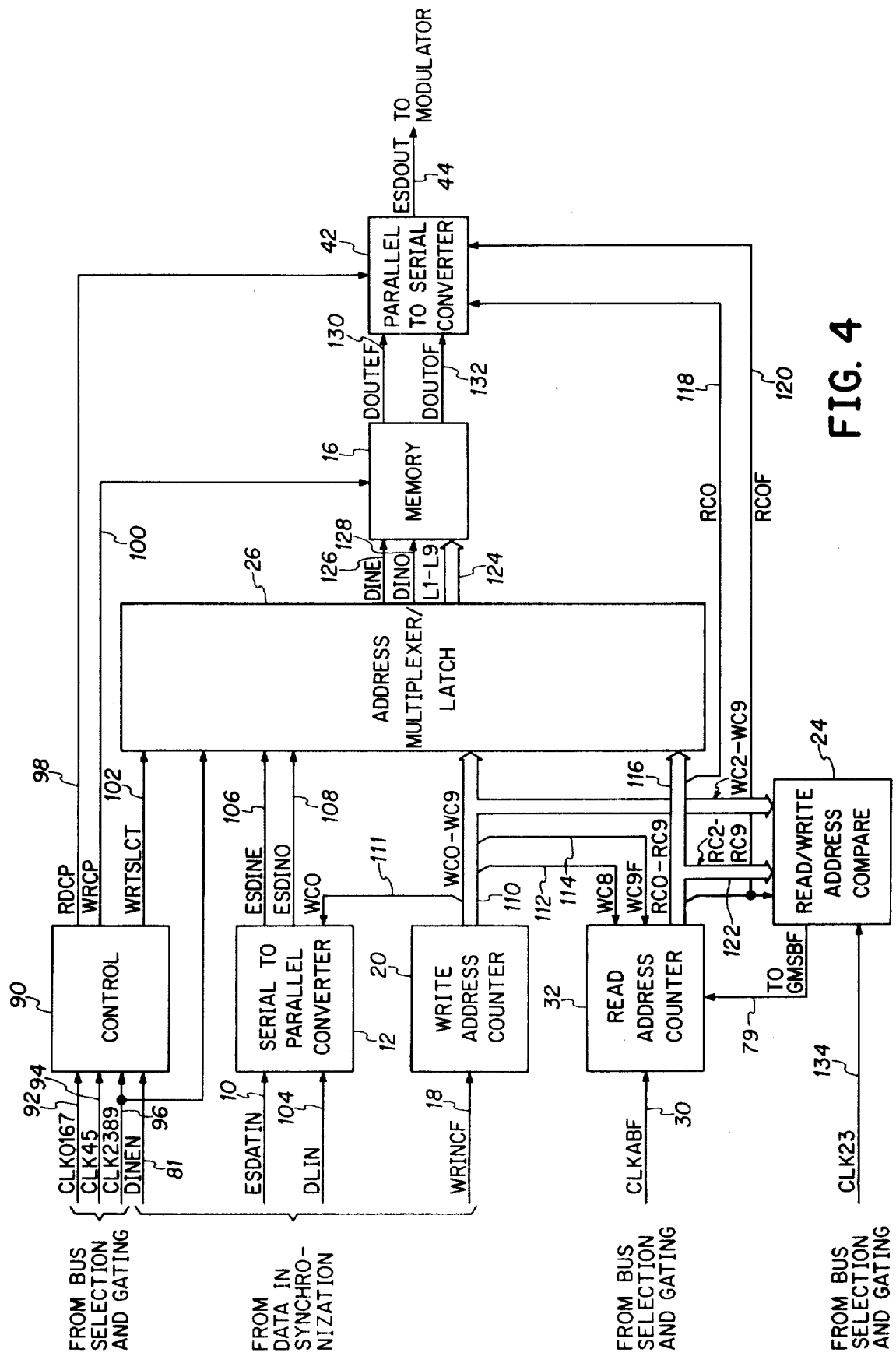
Figure 5:
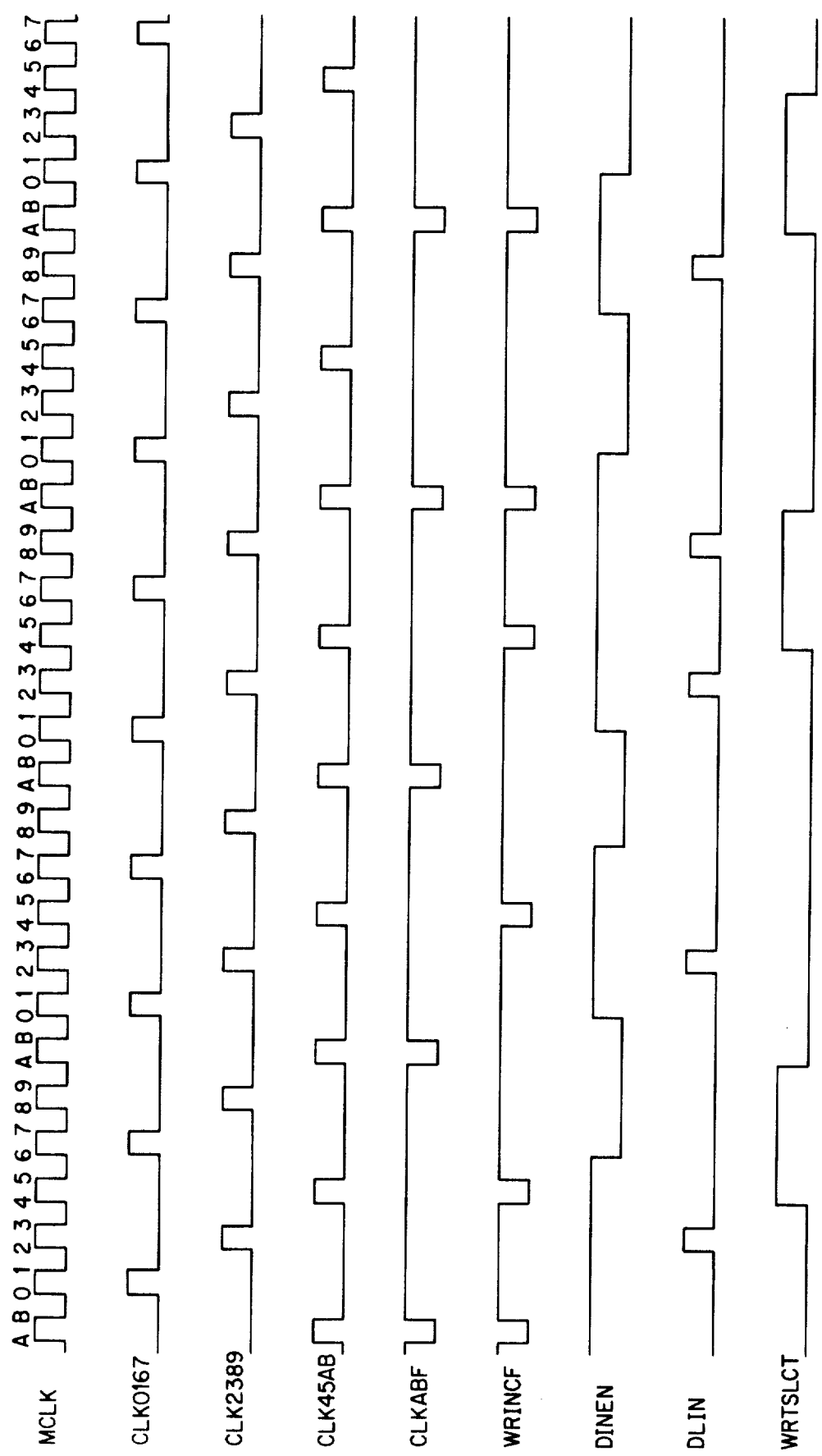
Figure 6:
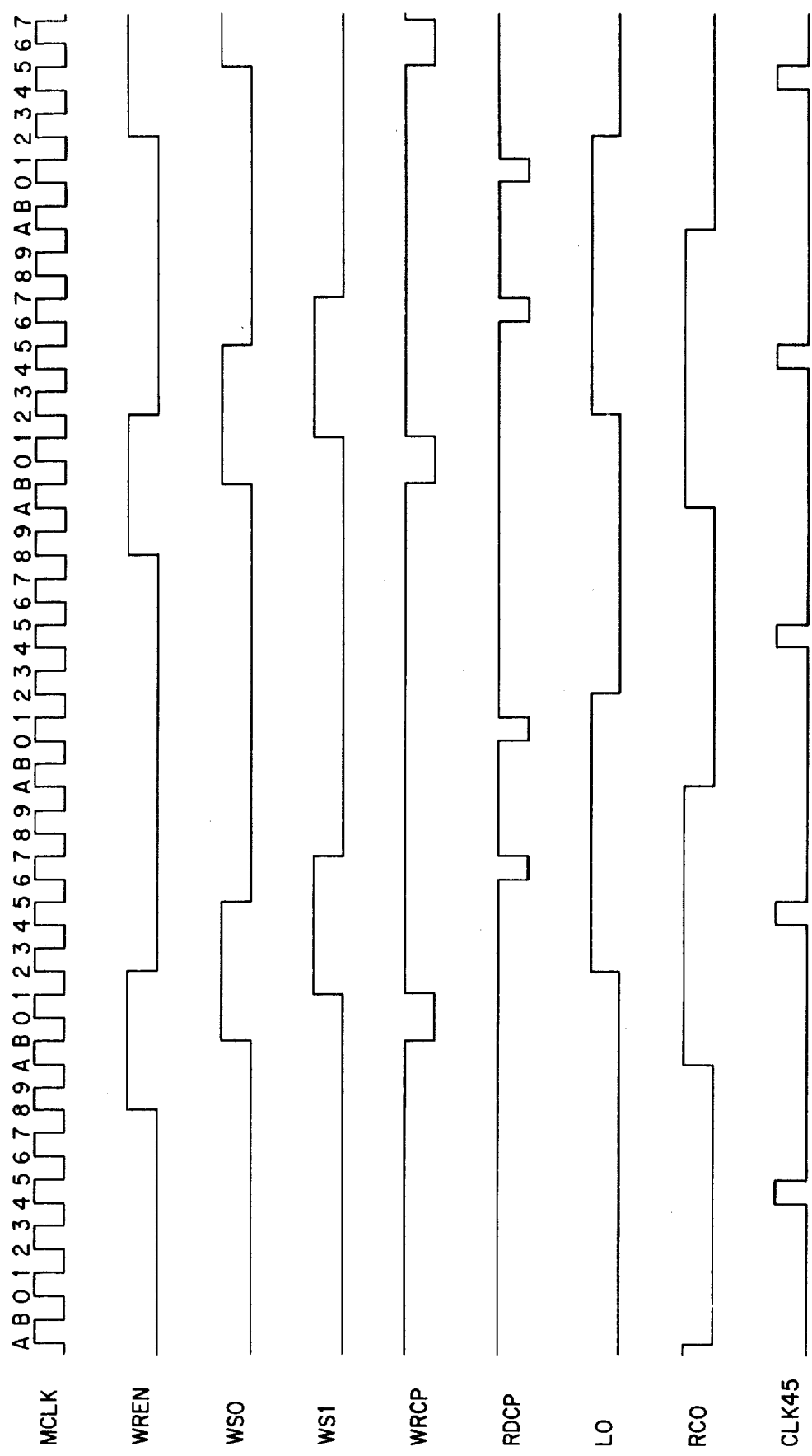

FIGS. 3a, 3b, and 3c comprise a detailed illustration of one embodiment of an inventive concept, illustrated by FIG. 1;

FIG. 4 is a more detailed block diagram illustrating generally the contents of FIGS. 3a, 3b and 3c; and FIGS. 5 and 6 are waveforms used in explaining the operation of the other figures.

DETAILED DESCRIPTION

In FIG. 1 a lead 10 supplies input data from, as an example a T1 carrier, to a serial to parallel converter 12 which supplies data in two bit parallel form on lead 14 to a random access memory or RAM 16. A recovered clock signal is supplied on a lead 18 to a write address counter 20. The recovered clock signal is obtained from the data being input on lead 10. The write address counter is shown broken up into two sections where the most significant bit is illustrated on the left and although not shown, the least significant bit would be furthest to the right. An output of address counter 20 appears on a set of leads 22 and is applied both to a comparator 24 and to a multiplexing switch 26. An output of multiplexer 26 appears on a plurality of leads 28 and is applied as an address input to RAM 16. A local clock signal is supplied on a lead 30 to a read address counter 32 configured in the same manner as the write address counter. A plurality of leads 34 from address counter 32 are applied to comparator 24 as well as to a second input of multiplexer 26. An inverter 36 is illustrated connected between the most significant bit position of address counter 20 and read address counter 32. A further lead 38 is connected between the next to the most significant bit position of write address counter 20 and read address counter 32. The lead 38 is not significant to the invention but is illustrated merely because it was actually used in a constructed embodiment for convenience purposes. A set of leads 40 is connected between RAM 16 and a parallel to serial converter 42 which provides output data on lead 44. This is labeled delayed T1 data out because the device of FIG. 1 is used as an elastic store to resynchronize data from an incoming rate to a rate used by the local apparatus and as clocked by the signals appearing on clock lead 30. Finally, a lead 46 is connected from comparator 24 to an L (load) input of counter 32.

Figure 2:
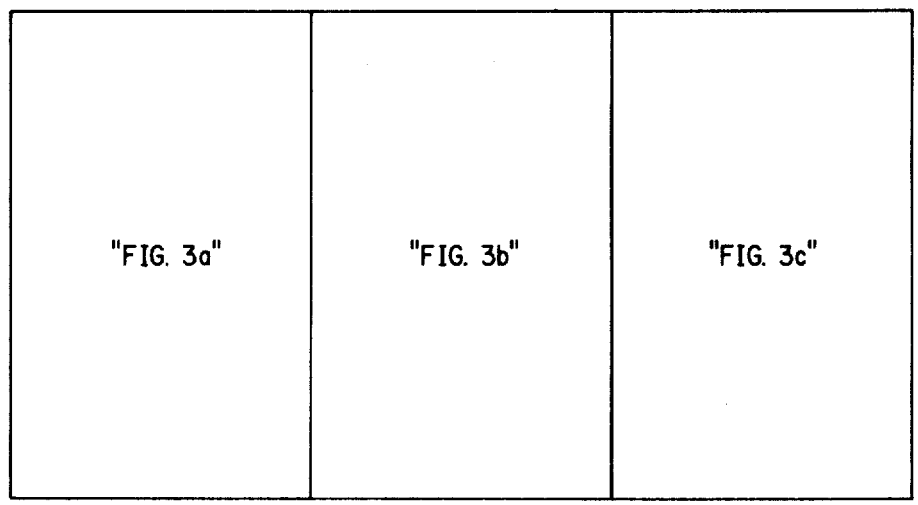
FIG. 2 is an illustration showing the arrangement of the detailed circuit diagram of FIGS. 3a, 3b and 3c.

As previously mentioned, FIG. 2 is merely an assembly drawing showing how the leads of the circuits in FIGS. 3a, 3b and 3c are connected.

In FIG. 3a a plurality of up/down counters 49, 51, and 53 are used for the write address counter illustrated as 20 in FIG. 1. These individual counter chips can be purchased under a manufacturer's part number 74LS191. A plurality of identical chips 55, 57, and 59 comprise the read address counter illustrated as 32 in FIG. 1. These counters are all connected in the count up mode. Three blocks 61, 63, and 65 in FIG. 3b provide the multiplexer/latch function of block 26 in FIG. 1. Each of these blocks has a part number of 74LS298. There are also four blocks 67, 69, 71, and 73 which form the RAM 16 of FIG. 1. Each of these blocks has a manufacturer's part number of 74S201. A read/write address compare generally designated as 24 contains two chips 75 and 77 in FIG. 3c, each of which has a manufacturer's part number of 74LS85. Although these types of parts to provide identical functions can be obtained from many different manufacturers, the ones used in this invention were from National Semiconductor Corporation. Referring back to FIG. 3a, it will be realized from an inspection that the uppermost leads from the two counters are the least significant bit while the most significant bits are taken from the lower blocks 53 and 59. Since only ten bits of information were required, only two bits were used from the lowermost counters. Most of the circuitry below the blocks 20, 32, and 26 in FIGS. 3a and 3b comprise the serial to parallel converter 12 while the circuitry in the upper righthand portion of FIG. 3c comprises the parallel to serial converter 42. Each of these blocks contains various D and J-K flip-flops as well as inverters and NAND gates and AND gates.

The line labeled ESDATIN is designated 10 since it provides the Elastic Store Data Input as illustrated in FIG. 1. The recovered clock signal 18 has the label WRINCF for write in clock false. A lead 30 is labeled CLKABF as clock A B false. This is synonymous with the local clock 30 of FIG. 1. A lead 79 is labeled TOGMSBF and is the same as that output from the comparator circuit 24 of FIG. 3c and is identical to lead 46 of FIG. 1. A lead 81 labeled DINEN is the Data Input Enable for timing purposes relative to the Elastic Store Data received on 10 which is converted to a 2 bit parallel format in converter 12. The rest of the signals can be determined as to timing and waveform from the illustrations in FIGS. 5 and 6. In FIG. 4, a control block 90 is shown receiving clock signals on three leads; 92, 94 and 96 which are received from a bus selection and gating section of circuitry which need not be described since the waveforms are illustrated in other figures. A Read Clock Pulse is output from control 90 on lead 98 while a write clock pulse is output on lead 100. A Write Clock Select is output on lead 102. As shown lead 98 is connected to a parallel to serial converter previously shown as 42 while lead 100 is connected to memory or RAM previously shown as 16. Finally, lead 102 is connected to a multiplexer/latch previously shown as 26. The Data In Enable lead is labeled 81 as shown in FIG. 3a and is also applied to control 90. An elastic store data in lead 10 is shown connected to a serial to parallel converter previously designated as 12. An input clock is shown on lead 104 and is labeled DLIN. A recovered clock lead 18 is shown applied to the write address counter 20. The signals appearing on the last four leads 81, 10, 104, and 18 are obtained from a data in synchronization block (not shown). Signals representative of Data In, Even and Odd, are shown respectively on leads 106 and 108 and are supplied from the converter 12 to the latch 26. The odd and even signals are representative for timing purposes of the first or second of the parallel bits to be output. As previously indicated the serial to parallel converter is a two bit serial to a two bit parallel converting device and thus even and odd are the terminology for the first and second of the two bits. An output of the write address counter is illustrated as a plurality of leads 110, applied to latch 26 with some of these leads being applied to the read/write address compare 24. A single lead illustrated as WCO is designated as 111 and applied from write address 20 to the converter 12. The read address counter 32 receives the local phase clocks on lead 30 and also receives the write address counter true bit number 8 on lead 112 and the ninth false bit on lead 114. Read counter 32 further receives gating or load signals on lead 79 (same as 46 in FIG. 1) from compare circuit 24. Read address counter 32 supplies a plurality of signals on leads 116 to latch 26 as well as supplying specific signals of RCO on lead 118 to converter 42 and RCO False on lead 120, both to compare circuit 24 and to converter 42. A further plurality of leads 122 from bundle 116 to compare circuit 24 contains the information in bit positions two through nine of counter 32. Bits one through nine of either of the counters 20 and 32 are output from latch 26 to memory 16 on a plurality of leads 124. It may be noted that the least significant or zero bit is not needed because the data is written two bits at a time in two separate memory sections of block 16 and thus the least significant address bit is not required. Data signals on leads 126 and 128 are designated as DINE and DINO, meaning Data in Even and Odd. Data Out Even False Signals are supplied on lead 130 to converter 42 while Data Out Odd False signals are supplied on lead 132. The elastic store output signals are supplied on lead 44 to be used by switching or other equipment. Finally, clock signals illustrated as clock 23 are input to compare circuit 24 on a lead 134.

In understanding FIGS. 5 and 6, it must be first realized that the phases of the master clock are represented by the designations zero through nine and AB. Thereafter there is a repeat pattern. The signal clock 0167 will be understood as having a logic 1 condition occurring between the zero and one positions of the master clock and between the six and seven positions of the master clock and the remaining time being at a logic 0. Likewise, clock 2389 is logic 1 between positions two and three of the master and eight and nine of the master clock. If this signal had an "f" thereafter, thereby indicating it to be the false representation, these times would be the only times that the signal were a logic 0. Thus, the clocks 45, 45AB and ABF are self-explanatory. The recovered clock signal WRINCF is synchronous with the incoming data and it is shown closer together in two different sections in exaggerated amounts for clarity in subsequent discussions. The Data In Enable signal DINEN is responsive to and logically obtained from the incoming data and therefore is not synchronous with the master clock. The Data Load In signal DLIN is generated from the Data In Synchronization Circuitry and is a timing signal derived from the DINEN signal (logically the "and" of DINEN and CLK2389). The next signal is a Write Select signal which is applied on lead 102 to latch 26 and if the signal is a logic 1, data is written into the memory and if it is a logic 0, data is read from the memory and applied to the output 44. The next signal is Write/Read Enable and is a delayed version of the above signal. The following two signals, WS0 and WS1 are the Write State 0 and 1 and are delayed versions of the Write Enable Signal used to generate the Write Clock Pulse shown on the following line, and as illustrated in the lower left-hand portion of FIG. 3b wherein two J-K flip-flops receive the WREN signal and output the WSO and WSIF signals through a NAND gate. The Read Clock Pulses are shown next. This signal is generated from the Read Enable signal in conjunction with clock 0167 and the least significant bit (L0) from latch 26. Finally, an RCO signal and a clock 45 signal are shown. The RCO clock is the least significant bit of the read address counter and is used in the parallel to serial conversion.

OPERATION

As previously indicated, and referring to FIG. 1, the data coming in on line 10 is converted to a two bit parallel form and inserted into the memory 16. The insertion occurs in a location of memory determined by signals received from write address counter 20 under the control of block 90 of FIG. 4 (not shown in FIG. 1). On the immediately subsequent time interval, period or slot, two parallel bits of data are read out of memory 16 into parallel to serial converter 42 in accordance with an address determined by counter 32 and also under control of block 90 of FIG. 4. These two bits are converted to serial form and are output on lead 44. The multiplexer 26 continually changes from transferring write address to transferring read addresses and back again. As an example, the data coming in may be written into data slot 16 and read from data slot 55. On the next pair of time slots, the next two bits of data would be read into space or slot 17 and read from slot or space 56. As long as the recovered and local clocks are synchronous, this spacing of 39 bits or number positions will remain constant. However, the recovered clock and the local clock are not normally synchronous and one will be faster than the other. Since the two clock signals on leads 18 and 30 are used to increment the counters 20 and 32, the counts, which go from zero to maximum and then "flop-over" and return to zero, will on occasion have the same count or address.

If for example the address in both counters is equivalent to a count of 16, and the local clock is slightly faster than the recovered clock, the data is read in to memory 16 on one time slot and read out on the immediately next time slot. When the devices are incremented, the next data will be read into space 17 and in all probability the data will be read out of space 17; however, at some point in time, the local clock will change the address in counter 32 enough in advance of counter 20 so that the data will be read out of memory 16 which was inserted one complete cycle earlier and thus, as an example, by the time the counters reach a count of 32, the data written in is written into a memory slot having an address of 32 while in the next time slot, the data is read out of position or slot 33.

This occasional change from current data to data which was received a complete memory capacity previously creates a disruption in data but is not as bad as another alternative of the two clocks "dithering" or changing in frequency such that at some times the local clock is reading the data most recently received and alternating between that and the data which was received a full cycle (frame of data or complete memory capacity) previously. This produces large amounts of errors and is intolerable in a data transmission system. As will be noted, the present system is a T1 data line elastic store apparatus and is being used as an alternative to the prior art approach of having a long register which is approximately half filled at the start and wherein data is clocked in by the recovered clock and read out by the local clock.

As will be realized from observing FIGS. 3a through 3c, all but the two least significant bits from counters 20 and 32 are applied to comparator 24. The comparator will provide an output on the gate lead 79 when there is a comparison. Since the least two significant bits are not compared, this comparison occurs when the two counts are in actuality one usable address count apart. The reason that it is not four counts apart is that the least significant bit is ignored in addressing the memory to compensate for the fact that there are parallel (odd and even) bits to be stored or read. In any event, the signal on gate 79 allows loading of an inverted form of the most significant bit from counter 20 to be inserted into counter 32 and thus produce a maximum alteration in the two address counts. For convenient minimization of circuitry, the next most significant bit is also applied to read address counter 59, but this bit logic value will be the same for each of the two numbers and thus the gate signal is not shown as activating this bit.

To summarize, the read and write operations are both sequential operations and are multiplexed to occur alternately and whenever the two addresses provided by the counters 20 and 32 approach each other, a comparator 24 activates a counter to alter its most significant bit so as to provide a step function alteration in the alternate accessing of memory 16.

Although this does produce an instantaneous error in the output data (not in sync signals) in either jumping ahead or back in the data being read out so that either some is omitted or some is repeated, this is preferable to a "dithering" of output data which could produce repeated errors over a long period of time and cause synchronization problems in equipment connected to receive signals from line 44. Thus the present invention adjusts one of the addresses by two complete frames of information to maintain industry standard format synchronization pulse signals.

In view of the above information, it is believed that FIGS. 3a through 3c are fairly self-explanatory wherein the Write In clock False signals on lead 18 are received by the clock input of counter chip 49 and whenever this counter overflows, outputs are provided on output RC to the clock input of counter chip 51. When this overflows it activates the clock input of counter 53 so as to provide the total counter operation indicated as 20 in FIG. 1. A similar result is provided by the sections of counter 32 of FIG. 3a with the input clock pulse being received on lead 30. It will be noted that an inverter 36 is connected between the most significant bit position of portion 53 of counter 20 to portion 59 of counter 32. In addition, the next most significant bit positions are also connected together. Although this data is always applied to inputs A and B, it is only accepted by logic circuit 59 when an input signal is received on lead 79 to the load input of block 59. A Write Select signal WRTSLCT is obtained from the D flip-flop which is actuated by a combination of the Data In Enable signals and the least significant bit of counter 20. As mentioned previously, a logic 1 on this lead allows writing of data into memory and a logic 0 provides for reading from the memory. This signal on the S inputs of blocks 61, 63 and 65 determines which of the signals appearing on the A through D inputs of these blocks obtained from counters 20 and 32 will be passed through to the memory blocks 16. Logic circuitry comprising two J-K flip-flops immediately beneath block 65 receives a Write Enable signal and produces the Write State Zero and Write State One signals used in conjunction with an NAND gate to produce the Write Clock Pulses applied to the WE (Write Enable) inputs of blocks 16. These memory blocks are arranged such that the data is written into only two of the blocks in parallel at a time or read from only two of the blocks at a time. This information is output to the two D flip-flops on FIG. 3c and is clocked out under the control of either RCO or RCOF from these D flip-flops to output lead 44. The addresses obtained from the counters are supplied to the two comparator circuits 75 and 77 which, when bit positions two through nine compare, provide an output on lead 79 to activate the load input of counter block 59. As illustrated, the least significant bit of counter 32 is obtained from multiplex/latch 26 to generate the Read Clock Pulse and this same waveform signal is also directly obtained from counter 32 to produce the RCO pulse.

In view of the above explanations of FIGS. 1 and 3a through 3c, it is believed that further explanation of FIG. 4, which merely draws together the detailed circuit diagrams of FIGS. 3a, 3b and 3c is unnecessary.

While a single embodiment of the inventive concept has been described, it is not the only way of implementing the inventive concept and thus I wish to be limited only by the scope of the appended claims wherein the invention is claimed.

I claim:

1. Apparatus for preventing interference effects between nonsynchronized read and write circuits, each of which is cyclically activated to provide sequential addresses for application to a given addressable memory, comprising, in combination:
   addressable memory means for storing data including data input means for receiving previously generated data, data output means for supplying data, write address input means for inputting addresses, and read address input means for inputting addresses;
   write address signal means for providing a periodically incremented output write address ranging from most significant bit (MSB) to least significant bit (LSB);
   read address signal means for providing a periodically incremented output read address, the logic bits of the read address ranging from MSB to LSB;
   comparator means for comparing including first and second input means for inputting data and gating output means for providing a gating output signal when the address applied to said first input means approaches, closer than a predefined value, that supplied to said second input means;
   means connecting said write address signal means to said write address input means of said memory means and to said first input means of said comparator means for supplying address signals thereto;
   means connecting said read address signal means to said read address input means of said memory means and to said second input means of said comparator means for supplying address signals thereto; and
   gating means connected to at least one of said signal means and to said comparator means for altering the MSB position of said one of said signal means upon receipt of said gating output signal from said comparator means.

2. The method of reducing the amount of erroneous information obtained from read and write operations in sequentially actuated nonsynchronized addressing counters used with a given memory means comprising the steps of:
   comparing, through the use of a logic device, the read and write addresses supplied to an address input means of a memory means and providing a first output signal as the addresses approach, closer than a predefined value, each other; and
   altering the addresses of one of the inputs by a step value as a result of the occurrence of said first output signal whereby the amount of erroneous information obtained from the memory means in read operations is reduced.

3. The method of claim 2 wherein the step alteration is accomplished by altering the logic value of the most significant bit of the altered address.

4. The method of claim 3 wherein the step alteration is accomplished by forcing the logic level of the most significant bit (MSB) position of one address to be inverted with respect to the other address.

5. The method of providing an elastic store wherein incoming data read into an addressable memory uses a first clock to sequentially operate a first digital address counter and outgoing data written from an addressable memory uses a nonsynchronized second clock to sequentially operate a second digital address counter wherein each counter has a MSB position comprising the steps of:
   comparing, through the use of logic apparatus, the addresses of the above referenced counters; and
   inverting the MSB position of one counter when the two counters approach the same address whereby an addressable memory used as elastic store is provided that prevents interference between nonsynchronized read and write operations.

6. Apparatus for implementing elastic storage of data comprising, in combination:
   first means for supplying data at a first clock rate;
   second means for supplying cyclically recurring write addresses which change at said first clock rate;
   third means for supplying cyclically recurring read addresses which change at a second rate which may not be synchronized with said first clock rate, the addresses of said second and third means comprising digital indications ranging from MSB (most significant bit) to lesser significant bits;
   addressable memory means, connected to said first, second and third means and including read data out, for receiving data from said first means at a location defined by addresses received from said second means and outputting data, at said read data output, from locations defined by addresses received from said third means; and
   means connected to said second and third means for altering the logic level of the MSB of the address of one of said first and second means when a given plurality of address bit logic levels are identical.

7. Apparatus comprising; in combination:
   random access memory means for storing data including data input, data output and address input;
   means for receiving incoming data connected to said data input of said memory means for supplying nonsynchronized data thereto;
   write address means connected to said address input of said memory means for supplying sequentially occurring address signals thereto;
   read address means connected to said address input of said memory means for supplying sequentially occurring address signals thereto intermediate each of the address signals supplied by said write address means; and
   means connected to said write address means and said read address means for receiving address signals therefrom and for incrementing a most significant bit of the address signal of one of said address means as the addresses approach identical values.

8. Apparatus for maintaining synchronization in receiving equipment for utilizing T1 format data wherein short term frequency unstability of recovered and local clocks exceed the storage capacity of a synchronization circuit associated therewith comprising in combination:
   addressable data storage means for storing data;
   data supply means, connected to said data storage means for supplying data thereto;
   recovered clock signal means for supplying clock signals;
   sequential write address means, connected to said data storage means, for writing incoming data into consecutive locations in said data storage means at a rate determined by said recovered clock signal means;
   local clock signal means for providing clock signals which are nonsynchronous with respect to recovered clock signals;

data output means, connected to said storage means, for outputting data therefrom;

sequential read address means, connected to said data storage means, for reading data in consecutive locations in said data storage means and transferring the data, at a rate determined by said local clock means, to said data output means of said data storage means; and means, connected to said read address means and to said write address means, for altering the address of one of said address means by an amount equivalent to a double frame of T1 data when the addresses approach, closer than a predefined value, one another.

* * * * *

UNITED STATES PATENT AND TRADEMARK OFFICE
CERTIFICATE OF CORRECTION

PATENT NO. : 4,171,538
DATED : October 16, 1979
INVENTOR(S) : Daniel R. Sheller

It is certified that error appears in the above-identified patent and that said Letters Patent are hereby corrected as shown below:

IN THE SPECIFICATION:

Column 6, line 42, delete "an" and substitute therefor --a--.

Column 8, line 15, after "second" insert --clock--.

Signed and Sealed this

Eighth Day of April 1980

[SEAL]

Attest:

SIDNEY A. DIAMOND

*Attesting Officer*     *Commissioner of Patents and Trademarks*